United States Patent
Ackermann et al.

(10) Patent No.: US 7,756,650 B2
(45) Date of Patent: Jul. 13, 2010

(54) APPARATUS FOR DETECTION AND PROCESSING OF A MULTIPLICITY OF MEASURED VALUES IN AN HVDC TRANSMISSION INSTALLATION

(75) Inventors: Anja Ackermann, Obermichelbach (DE); Andreas Gerner, Nürnberg (DE); Ludwig Hügelschäfer, Bamberg (DE); Johann Meβner, Erlangen (DE); John-William Strauss, Rötenbach (DE); Günter Ünzelmann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 234 days.

(21) Appl. No.: 11/916,376

(22) PCT Filed: Jun. 2, 2005

(86) PCT No.: PCT/DE2005/001027

§ 371 (c)(1),
(2), (4) Date: Dec. 3, 2007

(87) PCT Pub. No.: WO2006/128399

PCT Pub. Date: Dec. 7, 2006

(65) Prior Publication Data

US 2009/0024337 A1 Jan. 22, 2009

(51) Int. Cl.
*G01R 15/00* (2006.01)
(52) U.S. Cl. .............................. 702/57; 702/60; 702/61; 702/64
(58) Field of Classification Search .................... 702/57, 702/60, 64
See application file for complete search history.

(56) References Cited

U.S. PATENT DOCUMENTS 4,320,444 A * 3/1982 Hausler et al. ................. 363/35

(Continued)

FOREIGN PATENT DOCUMENTS

DE 3912502 A1 11/1989

(Continued)

OTHER PUBLICATIONS

Arrillaga et al.: "Power Quality Following Deregulation", IEEE, 'Online', vol. 88, No. 2—Feb. 2000 pp. 246-261, XP 011044328.

(Continued)

*Primary Examiner*—Hal D Wachsman
*Assistant Examiner*—Mi'schita' Henson
(74) *Attorney, Agent, or Firm*—Laurence A Greenberg; Werner H Stemer; Ralph E Locher

(57) ABSTRACT

An apparatus for detecting and processing a multiplicity of measured values in an HVDCT system has measuring units for detecting measured variables of the HVDCT system, while obtaining measured values, and preprocessing units which are connected to one another in series, are each connected to at least one measuring unit and are connected to a control, regulation and monitoring system by means of a last preprocessing unit which is connected downstream of the rest of the preprocessing units, each preprocessing unit being set up to receive and preprocess the measured values, while obtaining optical measured values, and transmitting both the optical measured values generated by it and the optical measured values received from the upstream preprocessing units to a downstream preprocessing unit or to the control, regulation and monitoring system, with the result that the last preprocessing unit provides all of the measured values for the control, regulation and monitoring system.

10 Claims, 2 Drawing Sheets

U.S. PATENT DOCUMENTS

| | | | |
|---|---|---|---|
| 4,941,079 A * | 7/1990 | Ooi | 363/132 |
| 5,621,626 A | 4/1997 | Björklund et al. | |
| 5,737,166 A | 4/1998 | Hagman | |
| 6,204,493 B1 * | 3/2001 | Fischl et al. | 250/205 |
| 6,519,509 B1 | 2/2003 | Nierlich et al. | |
| 6,636,893 B1 | 10/2003 | Fong | |

FOREIGN PATENT DOCUMENTS

| | | | |
|---|---|---|---|
| EP | 0707370 A2 | 4/1996 | |
| EP | 0736949 A1 | 10/1996 | |

OTHER PUBLICATIONS

Miller et al.: "Multichannel Continuous Harmonic Analysis in Real Time", IEEE Transactions on Power Delivery, IEEE Service Center, New York, NY, vol. 7, No. 4, Oct. 1992 XP000298192.

European Office Action dated Jul. 28, 2009.

International Search Report dated Jan. 24, 2006.

* cited by examiner

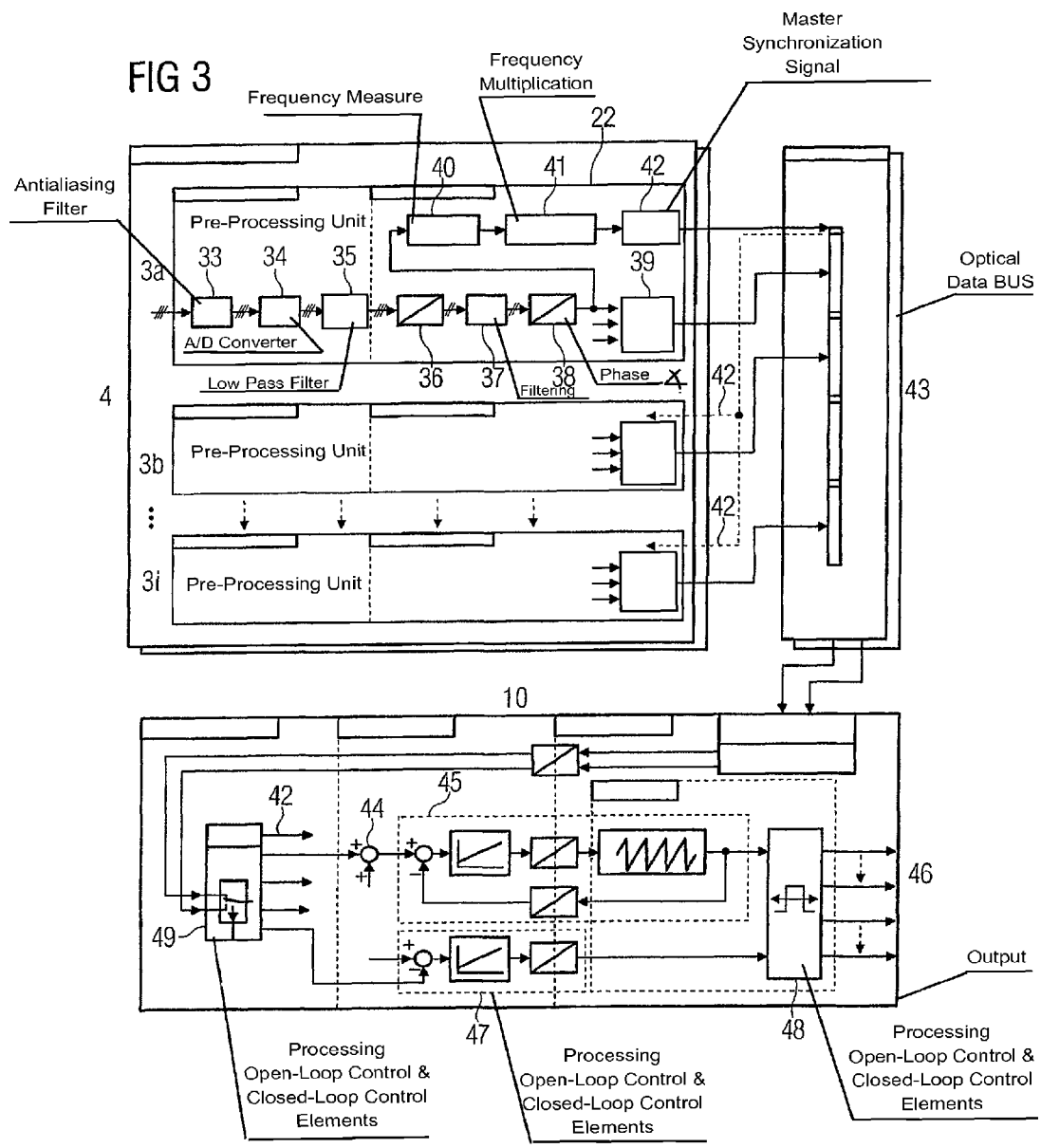

APPARATUS FOR DETECTION AND PROCESSING OF A MULTIPLICITY OF MEASURED VALUES IN AN HVDC TRANSMISSION INSTALLATION

BACKGROUND OF THE INVENTION

Field of the Invention

The invention relates to an apparatus for detection and processing of a multiplicity of measured values in an HVDC transmission installation.

In a high-voltage, direct-current transmission installation, a DC voltage is produced from a polyphase AC voltage in a first substation. The first substation is connected on the DC voltage side to a second substation, which converts the DC voltage back to a polyphase AC voltage. Reliable operation of an HVDC transmission installation such as this requires monitoring of the current flow and of the voltage, both on the AC voltage side and on the DC voltage side. A multiplicity of measurement units therefore provide measured values of said currents and voltages to an open-loop control, closed-loop control and monitoring system. On the one hand, the open-loop control, closed-loop control and monitoring system monitors the entire installation so as to allow rapid and safe disconnection of the HVDC transmission installation in the event of a fault. On the other hand, the open-loop control, closed-loop control and monitoring system is designed for closed-loop control of the substations. The substations comprise a multiplicity of power-electronic switching elements, for example thyristors. The thyristors must be triggered very precisely as a function of the phase angle of the AC voltage. The mains frequency is therefore determined in an open-loop control unit from the polyphase AC voltage signal produced by the measurement units, and the triggering times for the thyristors are calculated as a function of the mains frequency in a phase locked loop. Since the multiplicity of thyristors require a plurality of open-loop control units, the hardware for an open-loop control system such as this is highly complex. Furthermore, each open-loop control unit must have inputs for a polyphase AC voltage signal as well as the logic for carrying out signal processing on this AC voltage signal. The individual measurement units can, finally, be connected directly to the respective open-loop control units. This leads to a very high degree of wiring complexity, with the use of conventional transmission lines resulting in high sensitivity to electromagnetic interference.

BRIEF SUMMARY OF THE INVENTION

The object of the present invention is to design an apparatus of the type mentioned initially such that the transmission reliability and therefore the availability of the overall installation are improved, by reducing the hardware and wiring complexity.

According to the invention, this object is achieved by an apparatus for detection and processing of a multiplicity of measured values in an HVDC transmission installation having measurement units for detection of measurement variables in the HVDC transmission installation, with measured values being obtained and preprocessing units, which are connected in series with one another, are each connected to at least one measurement unit and are connected to an open-loop control, closed-loop control and monitoring system by means of a final preprocessing unit, which is connected downstream from the other preprocessing units, with each preprocessing unit being designed to receive and to process the measured values with optical measured values being obtained, and with both the optical measured values which are produced by it and the optical measured values received from upstream preprocessing units being transmitted to a downstream preprocessing unit such that the final preprocessing unit provides all the measured values for the open-loop control, closed-loop control and monitoring system.

A preprocessing unit such as this on the one hand considerably reduces the wiring complexity throughout the entire installation, since the individual measurement units need be connected only to preprocessing units which are associated with them, and the individual preprocessing units transmit their data via an optical bus system to the open-loop control, closed-loop control and monitoring system. This reduces the sensitivity to electromagnetic interference. At the same time, the hardware complexity in the open-loop control, closed-loop control and monitoring system is considerably reduced by designing the preprocessing unit to detect and preprocess the measured values associated with it.

In one advantageous refinement, the preprocessing units have means for frequency and phase measurement of a polyphase AC voltage signal. The frequency and phase are advantageously measured by one of the preprocessing units such that all the measured data can be transmitted to the open-loop control, closed-loop control and monitoring system as a function of the phase angle of the AC voltage, that is to say with phase synchronism. For the purposes of this further development of the invention, there is no need to readjust the phase for each subunit in the open-loop control, closed-loop control and monitoring system.

The preprocessing unit can be configured as a master unit or as a slave unit. This is advantageous since a configurable preprocessing unit can be produced independently of its subsequent function, thus reducing the production costs.

In one preferred embodiment, each preprocessing unit has a multiplicity of analog and digital inputs for detection of the measured values associated with them, and at least two optical outputs for transmission of the measured values. In one expedient development, each preprocessing unit has at least one optical input. On the one hand, this makes it possible to form an optical data bus for transmission of the measured values, while on the other hand, the measured values can be transmitted to independently operating open-loop control, closed-loop control and monitoring systems, by means of optical waveguides.

In one advantageous arrangement of the preprocessing units according to the invention, the preprocessing units are connected to one another, and the last preprocessing unit is connected to the open-loop control, closed-loop control and monitoring system by means of optical waveguides. The use of optical waveguides ensures that the preprocessed measured values are transmitted cost-effectively, safely and reliably, and in particular in a manner which is not sensitive to electromagnetic interference.

In one expedient refinement, a first preprocessing unit, which is not preceded by any other preprocessing unit, is configured as a master unit, and those preprocessing units which are connected downstream from the first preprocessing unit are configured as slave units. This is particularly advantageous since it may be sufficient, for example, for the master unit to measure the frequency and phase of the polyphase AC voltage signal.

The master unit is advantageously designed to produce a synchronization signal for the slave units and the open-loop control, closed-loop control and monitoring system. For example, the master unit may use the measured frequency of the polyphase AC voltage signal to produce a system clock by means of frequency multiplication, which system clock is used by the slave unit as a clock for the preprocessing of the measured values associated with them, while at the same time allowing synchronized transmission of the preprocessed measured values.

In one expedient refinement, the master unit is designed to produce an input signal for a phase locked loop which is arranged in the open-loop control, closed-loop control and monitoring system.

In one preferred embodiment, each preprocessing unit has a multiplicity of inputs for the measured values, configuration means for selection of a function as a master unit or slave unit, means for preprocessing of the measured values and electro-optical transducers for conversion of the preprocessed measured values to optical data and transmitting and receiving means, with the means for preprocessing having input circuitry for detection and conversion of analog measured values to digital values, as well as a programmable gate array and a digital signal processing unit. A circuitry arrangement such as this makes the apparatus suitable for flexible use, since the use of electronic components such as a programmable gate array and a digital signal processing unit, for example a digital signal processor, allows versatile use, for example as a master or slave unit, simply by changing the programming of the programmable gate array or of the digital signal processing unit.

The input circuitry advantageously has operational amplifiers, low-pass filters, sampling means and analog/digital converters. Input circuitry such as this allows analog electronic signals to be converted to digital values, which are processed further in the programmable gate array and in the digital signal processing unit.

In one expedient refinement, the digital signal processing unit is designed to determine the frequency of the polyphase AC voltage signal. This is particularly advantageous since a digital signal processing unit, such as a digital signal processor, can be designed to determine digital values easily in this way, and the frequency can be used in order to produce the master synchronization signal.

The invention will be explained in more detail using one exemplary embodiment and with reference to the attached drawings, in which:

BRIEF DESCRIPTION OF THE SEVERAL VIEWS OF THE DRAWING

FIG. 3 shows a schematic illustration of the data processing in the apparatus as shown in FIG. 1.

DESCRIPTION OF THE INVENTION

Figure 1:
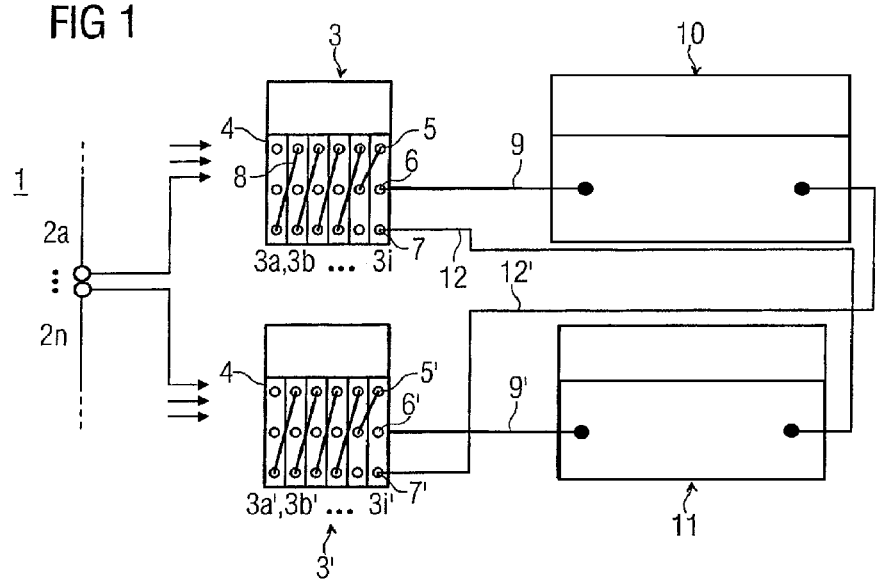
FIG. 1 shows one exemplary embodiment of the apparatus according to the invention.

FIG. 1 shows one exemplary embodiment of the apparatus according to the invention, as part of a high-voltage, direct-current transmission installation (HVDC transmission installation). The apparatus has a multiplicity of measurement units 2a to 2n for current and voltage measurement, both on the AC voltage side and on the DC voltage side of the HVDC transmission installation, of which FIG. 1 illustrates only one current transformer of the redundant design whose secondary currents are proportional to the alternating current flowing through the alternating-current busbar 1. Preprocessing units 3a to 3i are connected to the measurement units 2a to 2n via lines. It is self-evident that a preprocessing unit may also be connected to plurality of measurement units. The preprocessing units 3a to 3i have an input interface 4 for connection to the respective measurement units, as well as optical inputs 5 and outputs 6 and 7. The optical output 6 of a preprocessing unit is connected to the optical input 5 of a respective next preprocessing unit via an optical waveguide 8. The last preprocessing unit 3i is connected by its optical output 6 via an optical waveguide 9 to the open-loop control, closed-loop control and monitoring system 10. The second optical output 7 of the preprocessing unit 3i can be connected to a second independent open-loop control, closed-loop control and monitoring system 11 via a further optical waveguide 12. The same measured-value sensor are output at the two optical outputs 6 and 7 of the last preprocessing unit 3i. The connection of the optical output 7 to the second open-loop control, closed-loop control and monitoring system 11 provides the same measured-value set for this system 11 as for the opening-loop control, closed-loop control and monitoring system 10. In order to provide redundancy, the measurement units 2a to 2n are connected to a second arrangement of preprocessing unit 3a' to 3i'. Two mutually independent measurement systems 3 and 3' are provided by the preprocessing units 3a to 3i, which are connected in series with one another, and the preprocessing unit 3a' to 3i', which are likewise connected in series with one another. The optical output 6 of the preprocessing unit 3i in the first measurement system 3 is connected to the optical input of the open-loop control, closed-loop control and monitoring system 10, the optical output 7 of the preprocessing unit 3i is connected to a second open-loop control, closed-loop control and monitoring system 11. The optical output 6' of the preprocessing unit 3i' in the second measurement system 3' is connected to the optical input of the open-loop control, closed-loop control and monitoring system 11. The optical output 7' of the preprocessing unit 3' is connected to a second optical input of the open-loop control, closed-loop control and monitoring system 10. An arrangement of independent measurement systems 3 and 3' such as this as well as independent open-loop control, closed-loop control and monitoring systems 10 and 11 allows completely redundant open-loop control and monitoring of a high-voltage, direct-current transmission installation, since a further measurement system is available if one of the measurement systems 3 or 3' fails, while a further open-loop control, closed-loop control and monitoring system is also available in the event of failure of one of the open-loop control, closed-loop control and monitoring systems 10 or 11. A redundant configuration of the measurement and open-loop control, closed-loop control and monitoring systems such as this leads to considerably better availability, safety and reliability of the overall installation. As can be seen from FIG. 1, the use of a preprocessing unit according to the invention leads to considerably less wiring complexity and thus to considerably less sensitivity to electromagnetic interference since, in this arrangement, the preprocessing units are connected to the open-loop control, closed-loop control and monitoring systems via an optical data bus. In contrast, if the preprocessing units according to the invention were not to be used, each of the measurement units 2a to 2n would have to be connected to the respective open-loop control, closed-loop control and monitoring systems 10 and 11, which would not only enormously increase the wiring complexity but also the hardware complexity for the open-loop control, closed-loop control and monitoring systems, since the open-loop control, closed-loop control and monitoring systems would require many times the number of inputs for the individual measurement unit signals. The open-loop control, closed-loop control and monitoring systems 10 are connected via a line arrangement, which is not illustrated, to controllable components in the HVDC transmission installation.

Figure 2:
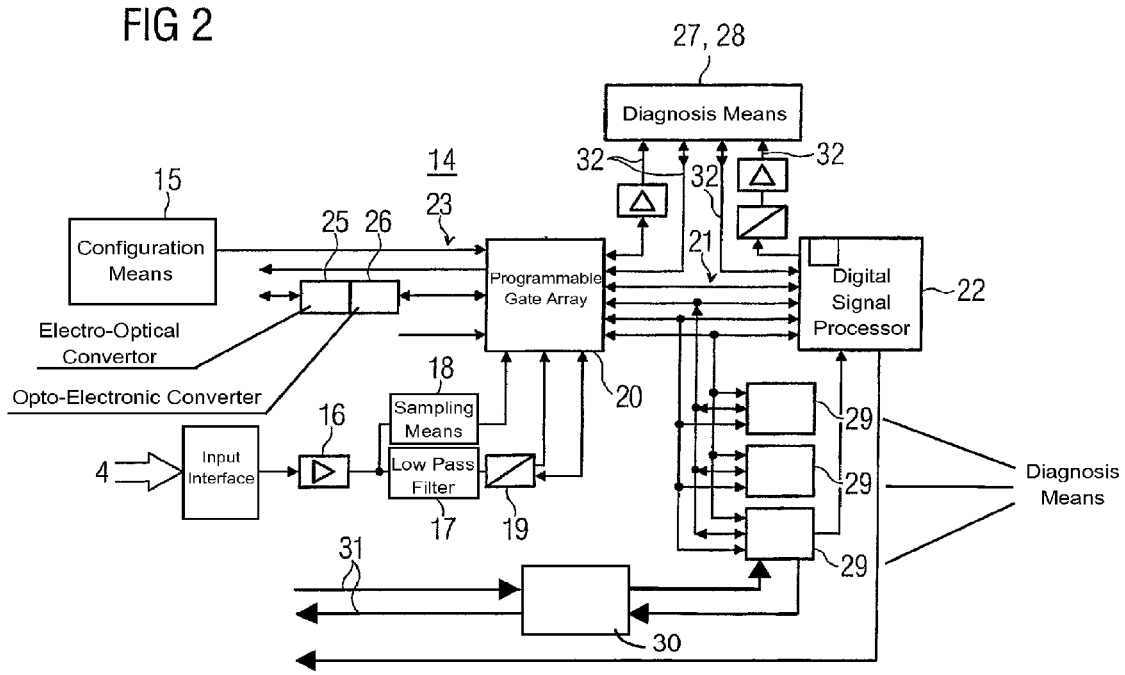
FIG. 2 shows a preprocessing unit for an apparatus as shown in FIG. 1.

FIG. 2 shows the design of a preprocessing unit 14 according to the invention. The preprocessing unit 14 has a configuration means 15 which allows the function of the preprocessing unit to be set as a master unit or slave unit, as well as an input interface 4 with analog inputs and input circuitry with an operational amplifier 16, a low-pass filter 17, sampling means 18 and an analog/digital converter 19. A programmable gate array 20 is connected to the input circuitry, and is connected via data lines 21 to a digital signal processing unit 22, for example a digital signal processor 22, and via further lines 23 to opto-electronic converters 25 and electro-optical converters 26 for transmitting and receiving optical data. The preprocessing unit 14 also has a range of diagnosis means 27 to 30 with communication lines 31, 32. If necessary, the diagnosis means can use the communications lines 31, 32 to reprogram the programmable gate arrays 20 or the digital signal processing unit 22 or, in the event of a fault, for fault finding and/or fault diagnosis.

The input circuitry with an operational amplifier 16, sampling means 18, low-pass filter 17 and analog/digital converter 19 is used to convert the data, which is received in analog form, to digital measured values which are processed in the programmable gate array 20 and in the digital signal processor 22. The digital measured values are passed via the programmable gate array 20 to the digital signal processor 22, in which they are evaluated and preprocessed. The digital signal processor 22 uses the measured values to determine the frequency of the measured AC voltage as well as current and voltage values, and passes these back via the data lines 21 to the programmable gate array 20. The programmable gate array 20 can receive data from other preprocessing units, via the optical bus connection 24 and an opto-electronic converter 26, and can temporarily store this data. The measured values received from the digital signal processor 22, together with the measured values received in other preprocessing units, are combined in the programmable gate array 20 to form a measurement value set, which is sent via an electro-optical converter 25 to the optical bus connection 24 for further data transmission to the next preprocessing unit or to the open-loop control, closed-loop control and monitoring system.

FIG. 3 shows a schematic illustration of the preprocessing of the measured values by the preprocessing units $3a \ldots 3i$ and the data transmission to the open-loop control, closed-loop control and monitoring system. The measured values transmitted by the measurement unit are converted by transducers, which are not illustrated, to voltages which can be processed and are passed to an antialiasing filter 33, which is connected to an A/D converter 34 for sampling and digitizing the measured values. The data is then processed by means of a low-pass filter 35 in order to suppress high-frequency interference components. The digital data is preprocessed in the digital signal processing unit 22 by carrying out a transformation process 36 of the three-phase signal to a two-phase signal, and by further filtering 37, in order to calculate the phase angle 38 of the signals, as well as further values, such as amplitudes and magnitudes of the signals. The data that has been preprocessed in this way is produced as measured values 39 for transmission to the open-loop control, closed-loop control and monitoring system.

In FIG. 3, the first preprocessing unit $3a$ is configured as a master unit, and the other preprocessing units $3b$ to $3i$ are configured as slave units. Additional processing steps are carried out in the digital signal processing unit 22 in the master unit $3a$. Once the phase angle 38 of the AC voltage signal has been determined as described above, the master unit $3a$ measures the frequency 40 of the AC voltage signal, after which the frequency is multiplied by a frequency multiplier 41. In this case, the measured frequency of the AC voltage signal is multiplied by a factor of 128. This multiplied frequency is used as a clock frequency for the digital signal processor in the individual slave units $3b \ldots 3i$, and for data transmission to the open-loop control, closed-loop control and monitoring system, and for the further processing there. The multiplication by a factor of 128 therefore allows the AC voltage signal to be sampled with 128 values per sample of the AC voltage signal. The master unit $3a$ produces a master synchronization signal 42 on the basis of the signal clock, which is calculated from the multiplied frequency and is transmitted to the other slave units $3b$ to $3i$, so that they are clocked by the master synchronization signal 42. The digital signal processing is carried out as described above in the individual slave units $3b \ldots 3i$ on the basis of the system clock that is produced in the master unit $3a$. At the same time, the master synchronization signal 42 is used for synchronization of the data transmission from the individual preprocessing units $3a \ldots 3i$ via the optical data bus 43 to the open-loop control, closed-loop control and monitoring system 10. The optical measured data values 39 are converted in the open-loop control, closed-loop control and monitoring system 10 to digital electronic signals. Once a correction factor 44 for the phase which results from the time required for calculation and preprocessing as well as for transmission has been calculated, the frequency of the AC voltage signal, as determined in the preprocessing unit $3a$, is used in a phase locked loop 45 to calculate the drive for the power-electronic switching elements. For this purpose, the discrepancy between the measured phase of the AC voltage signal and the phase of a controllable oscillator is determined in the phase locked loop 45, and the oscillator is readjusted on the basis of the discrepancy, such that a signal which is matched to the measured frequency is produced at the output 46 of the phase locked loop 45, by means of which the power-electronic switching elements in the HVDC transmission installation can be operated precisely. Further processing, open-loop control and closed-loop control elements, which are indicated schematically here by references 47, 48, 49, are, of course, arranged in the open-loop control, closed-loop control and monitoring system in order to process the data transmitted from the preprocessing units.

LIST OF REFERENCE SYMBOLS

1 AC busbar
2a to 2n Measurement units
3a to 3i Preprocessing units
4 Input interface
5 Digital-optical input
6, 7 Digital-optical outputs
8 Optical waveguide
9 Optical waveguide
10 Open-loop control, closed-loop control and monitoring system
11 Open-loop control, closed-loop control and monitoring system
12 Optical waveguide
13 Line arrangement
14 Preprocessing unit
15 Configuration means
16 Operational amplifier
17 Low-pass filter
18 Sampling means
19 Analog/digital converter
20 Programmable gate array
21 Data lines
22 Digital signal processor
23 Lines
25 Electro-optical converter 26 Opto-electronic converter
27 to 30 Diagnosis means
31, 32 Communication lines
33 Antialiasing filter
34 A/D converter
35 Low-pass filter
36 Transformation
37 Filtering
38 Phase angle
39 Measured data values
40 Frequency measurement
41 Frequency multiplication
42 Master synchronization signal
43 Optical data bus
44 Phase correction
45 Phase locked loop
46 Output
47, 48, 49 Processing, open-loop control and closed-loop control elements

The invention claimed is:

1. An apparatus for acquiring and processing a multiplicity of measured values in an HVDC transmission installation, comprising:
a plurality of measurement units for detecting measurement variables in the HVDC transmission installation and acquiring measured values;
a plurality of preprocessing units connected in series with one another and each connected to at least one of said measurement units, said preprocessing units including a final preprocessing unit connected downstream of the remaining said preprocessing units and to an open-loop control, closed-loop control, and monitoring system;
each said preprocessing unit being configured to receive the measured values, to preprocess the measured values, and to produce optical measured values, wherein any optical measured values produced by the respective said preprocessing unit and the optical measured values received from upstream preprocessing units are transmitted to a respective downstream preprocessing unit or to the open-loop control, closed-loop control and monitoring system, to provide all the measured values for the open-loop control, closed-loop control and monitoring system by said final preprocessing unit;
each said preprocessing unit having a multiplicity of inputs for the measured values, configuration means for selection of a function as a master unit or a slave unit, preprocessing means for preprocessing the measured values, electro-optical transducers connected to said preprocessing means for converting preprocessed measured values to optical data, and transmitting and receiving means, said preprocessing means having input circuitry for detecting and converting analog measured values to digital values, a programmable gate array, and a digital signal processing unit.

2. The apparatus according to claim 1, wherein said preprocessing units include means for frequency and phase measurement of a polyphase AC voltage signal.

3. The apparatus according to claim 2, wherein said preprocessing units have a multiplicity of analog and digital inputs, for detection of the measured values associated therewith, and at least two optical outputs for transmission of the optical measured values.

4. The apparatus according to claim 3, wherein said preprocessing units have at least one optical input.

5. The apparatus according to claim 4, wherein said preprocessing units are connected to one another, and said final preprocessing unit is connected to the open-loop control, closed-loop control, and monitoring system by way of optical waveguides.

6. The apparatus according to claim 5, wherein said preprocessing units include a first preprocessing unit, said first preprocessing unit is not preceded by any other said preprocessing unit and is configured as a master unit, and wherein said preprocessing units connected downstream from said first preprocessing unit are configured as slave units.

7. The apparatus according to claim 6, wherein said master unit is configured to produce a synchronization signal for said slave unit and the open-loop control, closed-loop control, and monitoring system.

8. The apparatus according to claim 1, wherein said input circuitry comprises operational amplifiers, low-pass filters, sampling means, and analog/digital converters.

9. The apparatus according to claim 8, wherein said digital signal processing unit is configured to determine a frequency and phase of a polyphase AC voltage signal.

10. An apparatus for acquiring and processing a multiplicity of measured values in an HVDC transmission installation, comprising:
a plurality of measurement units for detecting measurement variables in the HVDC transmission installation and acquiring measured values;
a plurality of preprocessing units connected in series with one another and each connected to at least one of said measurement units, said preprocessing units being connected to one another, said preprocessing units being configurable as a master unit or as a slave unit, said preprocessing units including means for frequency and phase measurement of a polyphase AC voltage signal, said preprocessing units having a multiplicity of analog and digital inputs for detection of the measured values associated therewith, and at least two optical outputs for transmission of the optical measured values, said preprocessing units having at least one optical input, said preprocessing units including a first preprocessing unit, said first preprocessing unit not being preceded by any other said preprocessing unit and being configured as a master unit, said preprocessing units connected downstream from said first preprocessing unit being configured as slave units, said preprocessing units including a final preprocessing unit connected downstream of the remaining said preprocessing units and to an open-loop control, closed-loop control, and monitoring system, by way of optical waveguides, said master unit being configured to produce a synchronization signal for said slave unit and the open-loop control, closed-loop control, and monitoring system, said master unit being configured to produce an input signal for a phase locked loop disposed in the open-loop control, closed-loop control, and monitoring system;
each said preprocessing unit being configured to receive the measured values, to preprocess the measured values, and to produce optical measured values, wherein any optical measured values produced by the respective said preprocessing unit and the optical measured values received from upstream preprocessing units are transmitted to a respective downstream preprocessing unit or to the open-loop control, closed-loop control and monitoring system, to provide all the measured values for the open-loop control, closed-loop control and monitoring system by said final preprocessing unit.

* * * * *